US011156776B2

(12) United States Patent
Genoe et al.

(10) Patent No.: US 11,156,776 B2
(45) Date of Patent: Oct. 26, 2021

(54) DETECTOR COMPRISING A WAVEGUIDE

(71) Applicant: IMEC VZW, Leuven (BE)

(72) Inventors: Jan Genoe, Testelt (BE); Robert Gehlhaar, Herent (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/938,188

(22) Filed: Jul. 24, 2020

(65) Prior Publication Data

US 2021/0026070 A1 Jan. 28, 2021

(30) Foreign Application Priority Data

Jul. 24, 2019 (EP) ..................................... 19188072

(51) Int. Cl.
| | |
|---|---|
| *G02B 6/26* | (2006.01) |
| *G02B 6/122* | (2006.01) |
| *G02B 6/12* | (2006.01) |
| *H01L 31/0232* | (2014.01) |

(52) U.S. Cl.
CPC ....... *G02B 6/1228* (2013.01); *G02B 6/12004* (2013.01); *H01L 31/02327* (2013.01)

(58) Field of Classification Search
CPC .............. G02B 6/1228; G02B 6/12004; G02B 6/12002; G02B 6/29332; G02B 6/4291; G02B 6/4215; H01L 31/02327; H01L 27/14629
See application file for complete search history.

(56) References Cited

U.S. PATENT DOCUMENTS

| | | | | |
|---|---|---|---|---|
| 5,418,870 | A | 5/1995 | Keck et al. | |
| 5,747,796 | A | 5/1998 | Heard et al. | |
| 7,515,793 | B2 | 4/2009 | Dehlinger et al. | |
| 9,316,800 | B1 * | 4/2016 | Celo | G02B 6/4249 |
| 2003/0108294 | A1 * | 6/2003 | Zheng | G02B 6/42 |
| | | | | 385/39 |

(Continued)

FOREIGN PATENT DOCUMENTS

DE 19633569 A1 2/1998

OTHER PUBLICATIONS

Arkwright et al. "Optical-to-Electrical Wavelength Demultiplexing Detector: Design, Fabrication, and Analysis" Journal of Lightwave Technology, vol. 14, No. 4, Apr. 1996.

*Primary Examiner* — Ellen E Kim
(74) *Attorney, Agent, or Firm* — Moser Taboada

(57) ABSTRACT

A semiconductor detector (100) for electromagnetic radiation within a wavelength range is disclosed, comprising a first waveguide portion (110), a funnel element (130) configured to funnel incident electromagnetic radiation into a first end (112) of the first waveguide portion, and a second waveguide portion (120) extending in parallel with the first waveguide portion. The second waveguide portion is coupled to the first waveguide portion and configured to out-couple electromagnetic radiation from the first waveguide portion, within a sub-range of the wavelength range. Further, a photodetector (140) including a photoactive layer (144) is arranged at a second end (114) of the first waveguide portion and at an end (124) of the second waveguide portion, and configured to separately detect electromagnetic radiation transmitted through and exiting the first waveguide portion and the second waveguide portion.

12 Claims, 5 Drawing Sheets

(56) References Cited

U.S. PATENT DOCUMENTS

| | | | |
|---|---|---|---|
| 2004/0013367 A1* | 1/2004 | Herbert | H01L 31/1075 385/39 |
| 2007/0104411 A1* | 5/2007 | Ahn | G02B 6/12004 385/14 |
| 2014/0054661 A1 | 2/2014 | Yu et al. | |

* cited by examiner

DETECTOR COMPRISING A WAVEGUIDE

CROSS-REFERENCE TO RELATED APPLICATION

This application claims priority to the European Patent Application No. 19188072.3 filed on Jul. 24, 2019, which is hereby incorporated by reference in its entirety.

TECHNICAL FIELD

The present inventive concept relates to a semiconductor detector, which makes use of a waveguide for guiding electro-magnetic radiation. In particular, the detector makes use of a coupling between a first and a second waveguide portion to separately detect electromagnetic radiation within different wavelength ranges.

BACKGROUND

Electromagnetic radiation, e.g. including waves of ultraviolet light, visible light or infrared light, may be useful as information carriers in many different applications. Various detectors are therefore employed to record the electromagnetic radiation and transform it into an electric signal that can be processed and analysed.

In imaging devices, such as for example cameras, electromagnetic radiation in the visible wavelength range may be recorded by means of a CMOS sensor comprising colour filters. The pixels of the camera may comprise colour filters that are employed to filter out different wavelength ranges of the incoming light, such as for example red, green and blue light, and direct the individual colours to a respective sensor. The registered signal from each sensor may then be used to determine the intensity of the respective colour and thus the wavelength composition of the incoming light.

This technology has however turned out to be associated with drawbacks, in particular regarding the prospects of further downscaling. The filtering of the incoming light reduces the sensitivity of the sensor, and problems have arisen regarding optical cross talk and reduced production yield.

In order to improve detection of electromagnetic radiation, it would be of interest to increase the sensitivity of the detector and enable further downscaling.

SUMMARY

An objective of the present inventive concept is to provide a semiconductor detector exhibiting a high sensitivity to electromagnetic radiation impinging on the detector. It is a particular objective of the present inventive concept to provide a detector that utilises a first and a second waveguide portion for guiding electromagnetic radiation towards a photodetector in a manner that allows for a separate detection of the electromagnetic radiation transmitted through the first waveguide portion and the second waveguide portion.

These and other objectives of the invention are at least partly met by the invention as defined in the independent claim. Preferred embodiments are set out in the dependent claims.

According to an aspect, there is provided a semiconductor detector for electromagnetic radiation within a wavelength range, comprising a first waveguide portion extending in a first direction and configured to be a single-mode waveguide for electromagnetic radiation within the wavelength range, a funnel element configured to funnel incident electromagnetic radiation into a first end of the first waveguide portion, and a second waveguide portion extending along the first direction and parallel with the first waveguide portion, and being configured to selectively guide electromagnetic radiation within a sub-range of the wavelength range. The second waveguide portion is coupled to the first waveguide portion and configured to out-couple electromagnetic radiation from the first waveguide portion, within the sub-range. The detector further comprises a photodetector including a photoactive layer arranged at a second end of the first waveguide portion and at an end of the second waveguide portion, and configured to separately detect electromagnetic radiation transmitted through and exiting the first waveguide portion and the second waveguide portion in the first direction.

The present invention is associated with several advantages. Firstly, by out-coupling electromagnetic radiation of the sub-range from the first waveguide portion, a colour-splitting of the incoming light is enabled, which in turn allows for a sensitivity enhancement of the detector. The sensitivity may in particular be increased in relation to other technologies utilising colour filters to filter out different wavelengths from the incoming light. With the present invention, it is possible to discriminate different wavelengths without using colour filters for controlling the wavelengths reaching the photoactive layer.

Secondly, the arrangement of the first and second waveguide portions along the first direction, which may be referred to as a vertical arrangement, allows for the waveguide portions to be manufactured with a cross section (taken across the first direction) having a width in the order of the wavelength of the light that is to be detected, i.e., in the range of hundreds of nanometres. This allows for the incoming electromagnetic radiation to be detected with a resolution that corresponds to the wavelength of the electromagnetic radiation.

Thirdly, the photodetector may be arranged directly beneath the waveguide portions, as seen in the direction of transmission of the electromagnetic radiation, which allows for a near-field arrangement that enables further downscaling of the detector.

The term "waveguide" may generally be understood as an element capable of transmitting electromagnetic waves along its length direction, which in the context of the present application is referred to as "first direction". Thus, the semiconductor detector according to the present invention may be oriented along the propagation direction of the electromagnetic radiation, with the funnel element and the photodetector arranged at opposite ends of the first waveguide portion, such that the incoming electromagnetic radiation may be guided from the funnel element to the photodetector along the length direction of the first waveguide portion.

The first waveguide portion may be referred to as a "full spectrum" waveguide, which should be understood as a waveguide capable of guiding a broader wavelength range than the second waveguide portion. Preferably, the first waveguide portion is a full spectrum waveguide in the sense that it, during use, may transmit electromagnetic radiation within the visible wavelength range. The first waveguide portion may be designed in relation to the electromagnetic waves to be guided by the first waveguide portion. Dimensions of the first waveguide portion need hence not be limited for use with a single specific wavelength of the electromagnetic radiation. Rather, the first waveguide portion may be used with a range of wavelengths, while providing desired propagation properties.

The second waveguide portion may be referred to as a "colour splitting" waveguide, referring to its capability of out-coupling electromagnetic radiation within a sub-range of the wavelength range of the electromagnetic radiation received by the first waveguide portion. Thus, the second waveguide portion may be understood as a waveguide capable of sorting out certain colours of incoming visible light, such as for instance a sub-range of wavelengths corresponding to red, green or blue light. Similar to the first waveguide portion, the second waveguide portion may hence be designed in relation to the electromagnetic waves to be guided by the second waveguide portion. Dimensions of the second waveguide portion need therefore not be limited for use with a specific wavelength of the electromagnetic radiation, but rather a sub-range of wavelengths corresponding to for example a red, green or blue spectrum while providing desired propagation properties.

The first and second waveguide portions may be arranged in parallel and beside each other, as seen in a direction orthogonal to the general propagation direction of the guided electromagnetic radiation. Preferably, they are aligned with each other such that their respective end portions, through which the guided electromagnetic radiation exits the first and second waveguide portions, are arranged on, or at the same distance from, the photodetector. It is preferred to arrange the end portions of the waveguide portions as close to the photodetector as possible, or even in an abutting manner, so as to provide a near-field configuration and allow for further downscaling of the detector.

As a consequence of the second waveguide portion being able to out-couple only a sub-range of the wavelength range guided through the first waveguide portion, the second waveguide portion may be dimensioned differently from the first waveguide portion. The operational wavelength range of the second waveguide portion may be determined by its cross section, i.e., the dimensions of the waveguide portion in a plane orthogonal to the propagation direction of the electromagnetic radiation through the first waveguide portion.

The coupling of electromagnetic radiation between the first waveguide portion and the second waveguide portion may be determined by the interface between the two portions. Preferably, the second waveguide portion is shorter than the first waveguide portion, and arranged such that the length portion of the first waveguide portion arranged between the second waveguide portion and the funnel element fulfils a single mode requirement for the sub-range that is to be out-coupled to the second waveguide portion. Thus, the coupling efficiency and the desired wavelength sub-range to be coupled may determine the dimensioning and relative orientation of the first and second waveguide portions.

According to some embodiments, the semiconductor device may comprise a funnel element arranged above the first waveguide portion, such that the first waveguide portion is stacked between the funnel element and the photodetector. The funnel element may be arranged to receive incoming electromagnetic radiation via an upper surface of the funnel element and transmit the light into the first end of the first waveguide portion via a lower portion, arranged opposite the upper surface. The upper surface may have a larger area than a cross section of the lower portion of the funnel element, such that the incoming light is funnelled into the first waveguide portion.

A single funnel element may be configured to transmit incoming light into a plurality of first waveguide portions. Further, it is appreciated that the funnel element may be formed as a separate part that is connected to the first waveguide portion, or as a unitary item formed in one piece with the first waveguide portion.

The photodetector may be understood as a means capable of transforming incident electromagnetic radiation, such as visible light, into an electrical signal. The photodetector may for example comprise a contact layer, a photoactive layer and an interconnect layer arranged on a semiconductor substrate. The photoactive layer may be arranged for converting photons into an electrical current, and may preferably be arranged closest to the waveguide portions. The contact layer may be arranged in between the waveguide portion and the photoactive layer. The interconnect layer may be arranged between the photoactive layer and the substrate. The contact layer and the interconnect layer may comprise electrodes to conduct the electric current to electric circuits and devices required for reading and processing the electric signal. The contact layer may be un-patterned, extending as a uniform layer in between the waveguide portions and the photoactive layer. The photoactive layer may be patterned into separate regions, for example corresponding to each of the waveguide portions, or be formed as a uniform layer extending below the waveguide portions. In some embodiments, the interconnect layer may be patterned into a plurality of electrodes or electrode regions, which for example may be aligned with a respective one of the first and second waveguide portions. The interconnect layer may hence comprise a first electrode associated with the first waveguide portion, and a second electrode associated with the second waveguide portion. The first electrode may be arranged below the first waveguide portion to register electromagnetic radiation guided through the first waveguide portion, whereas the second electrode may be arranged below the second waveguide portion to register electromagnetic radiation guided through the second waveguide portion.

Further, the first and second electrodes, and/or the portion of the photoactive layer arranged between the first and second electrodes and their respective waveguide portion, may be provided with thickness that is individually adjusted to the specific wavelength range to be detected. Hence, the electrode and/or photoactive layer portion under the first waveguide portion may be thicker and the electrode and/or photoactive layer portion under the second waveguide portion, and vice versa. This may advantageously improve the overall performance of the photodetector.

Reference may herein be made to a "vertical" direction to denote a direction along the first direction, or a normal to a substrate supporting the photodetector (i.e. a normal to a main/upper surface of the photodetector). Meanwhile, "vertical" qualifiers such as "below" and "above" may be used to refer of relative positions with respect to the vertical direction, and do hence not imply an absolute orientation of the detector. Accordingly, the term "below" may be used to refer to a relative position closer to a main surface of the substrate. The term "above" may be used to a position farther from a main surface of the substrate. For example, a first level or element located below a second level or element implies that the first level or element is closer to the main surface of the substrate than the second level or element is. Conversely, a first level or element located above a second level or element implies that the first level or element is farther from the main surface of the substrate than the second level or element is.

The term "horizontal" may meanwhile be used to denote a direction or orientation parallel to the substrate (i.e. a main plane of extension or main surface thereof), or equivalently transverse to the vertical direction. Further, a lateral direction may be understood as a horizontal direction.

According to an embodiment, the first waveguide portion and the second waveguide portion may be defined by different regions of a same waveguide body. Thus, the first and second waveguide portions may be made of a single piece, or formed into a single piece. This is advantageous in that no separation or spacing is allowed between the first and second waveguide portions, and thereby helps improve the coupling between the portions.

According to an embodiment, the first waveguide portion and the second waveguide portion may form separate waveguides. This is to be understood as the waveguide portions being made of two separate pieces, or being provided in the detector as two separate pieces that either are attached to each other or arranged spaced apart. Even though it may be advantageous to arrange the waveguide portions as closely together as possible, preferably with a zero separation, the waveguide portions may be arranged with a lateral spacing of 45 nm or less.

According to an embodiment, the waveguide portions may be arranged directly on the photodetector, such that electromagnetic radiation that is guided through the first and/or second waveguide portion may be transmitted into the photodetector without passing any intermediate layer or spacing. In case the photodetector comprises a contact layer, such as for example an optically transparent and electrically conducting layer comprising for instance indium tin oxide, ITO, the end portions of the first and second waveguide portions may be arranged directly on the contact layer. As a consequence, the waveguide portions may be arranged directly on the photodetector, but separated from the photoactive layer of the detector by a distance corresponding to the thickness of the contact layer.

Thus, the waveguide portions may according to some embodiments be arranged such that they are separated from the photoactive layer by a distance, which preferably may be smaller than a wavelength lying within the sub-range of the wavelength range of the electromagnetic radiation.

According to an embodiment, at least one of the second end of the first waveguide portion and the end of the second waveguide portion may have a funnel shape. In other words, the first waveguide portion and/or the second waveguide portion may comprise a funnel shaped end portion funnelling the guided electromagnetic radiation into the detector. The funnel shape may be help to concentrate the guided electromagnetic radiation to certain regions of the detector, which may make it easier to discriminate the electromagnetic radiation passing through the first waveguide portion from the electromagnetic radiation passing through the second waveguide portion at the detector and to reduce the risk for cross-talk.

According to some embodiments, a waveguide portion (i.e., the first and/or second waveguide portion) may have a substantially constant cross section along a major portion of its length extension. Put differently, the waveguide portion may have sidewalls that are oriented parallel to the first direction, or orthogonal to the main surface of extension of the detector. However, according to some embodiments, the waveguide portion may have a tapering shape, such that a cross section of the waveguide portion is reduced towards the detector. In other words, the sidewalls of the waveguide portion may form a non-orthogonal angle with the main surface of extension of the detector, or be oriented non-parallel to the first direction. A tapering shape may be particularly advantageous for waveguide portions having a relatively high index of refraction compared to the surrounding material, since this may improve optical confinement and increase the efficiency of the waveguide portion's capability of guiding electromagnetic radiation. In an example, the waveguide portions may be formed of silicon nitride and the surrounding material of silicon.

According to an embodiment, the tapering angle, i.e., the angle between the sidewall of the waveguide and the main plane of extension of the detector, may be 85°.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings, like reference numerals will be used for like elements unless stated otherwise.

DETAILED DESCRIPTION

Figure 1:
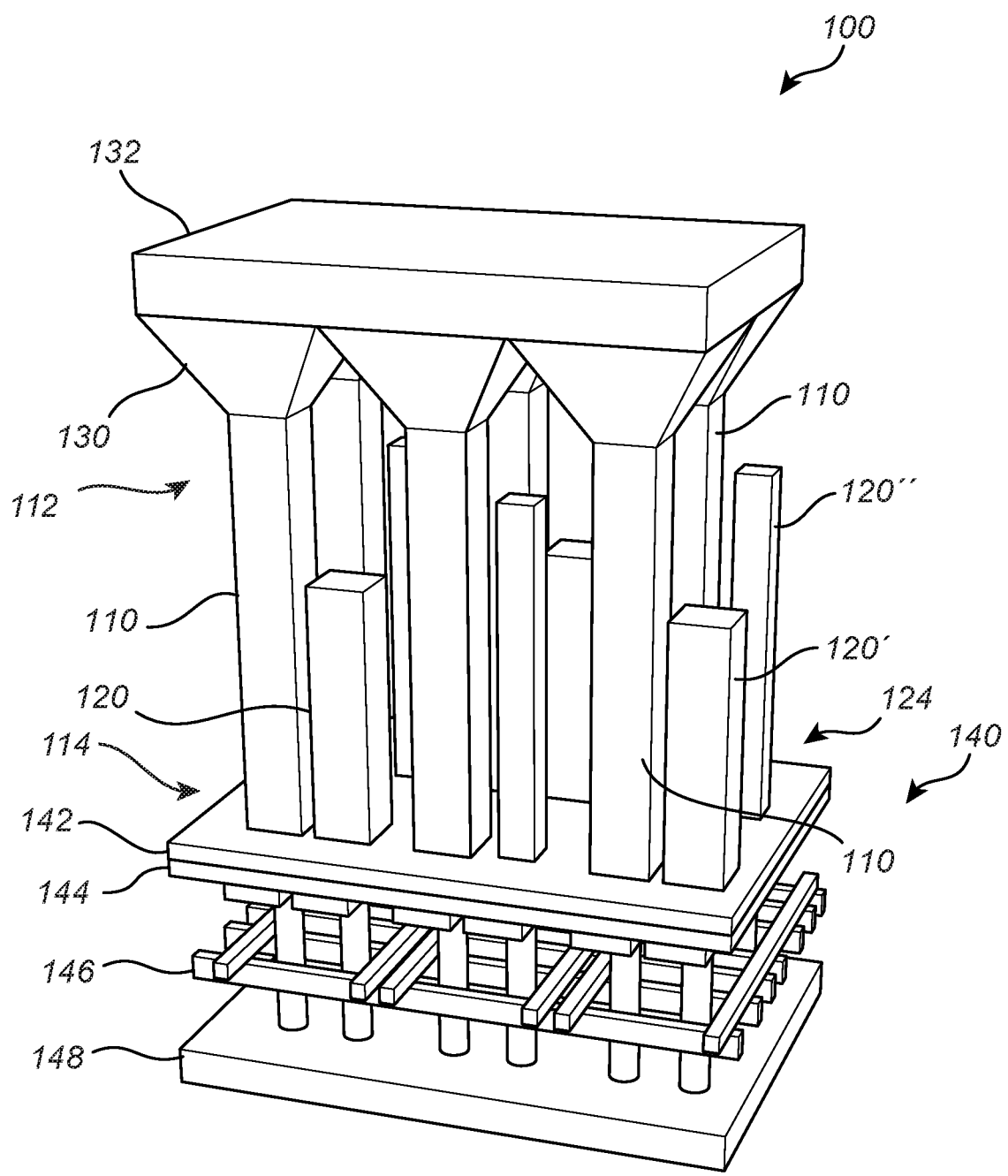
FIG. 1 is a perspective view of a semiconductor detector according to an embodiment.

Referring now to FIG. 1, a semiconductor detector 100 for detecting electromagnetic radiation within a wavelength range will be described.

The detector 100 is schematically illustrated in FIG. 1 in a perspective view. The detector 100 in the present example utilises a plurality of first waveguide portions 110' and second waveguide portions 120' for guiding incident electromagnetic radiation from a funnel element 130 towards a photodetector 140.

Each one of the first waveguide portions 110 may be arranged to extend in a first direction, such as a vertical direction, and may further be configured to be a single-mode waveguide for electromagnetic radiation within the wavelength range. In the following, the present invention will be exemplified with a detector for visible light, thus having a wavelength range in the visible part of the spectrum. Other wavelength ranges are however possible as well, such as for example infrared or ultraviolet, and the present invention should therefore not be construed as limited to visible light only.

Each one of the first waveguide portions 110' may extend between the funnel element 130, which may be provided as a separate element for each of the first waveguide portions 110, or form part of a larger structure that is common for several waveguide portions as shown in the present figure, and the photodetector 140, such that incoming light can be guided from a receiving upper surface 132 of the funnel element 130 towards the photodetector 140.

A cross section of a first waveguide portion 110, taken across the length direction or vertical direction of the first waveguide portion 110', 110" may be substantially constant along the entire length of the waveguide portion 110. Put differently, the sidewalls of the waveguide portion 110 may be substantially vertical, or parallel to a normal to a main plane of extension of the photodetector. Such a configuration is illustrated in FIG. 1. However, it is appreciated that other configurations may be employed as well, such as for example a tapered shape in which the cross section of the first waveguide portion 110' is reduced towards the photodetector 140. The tapering may be characterised by the angle the sidewall forms with the main plane of extension of the photodetector 140. In the present figure, the sidewalls may form a 90° angle with the photodetector. In other embodiments, not illustrated in the present figure, one or several sidewalls of the first waveguide portion 110 may form an angle that is less than 90°, such as for example 85° or less. The choice between straight sidewalls (i.e., constant cross section) or tapered sidewalls may depend on the desired optical transmission properties, which in turn may be determined by the type of material of the waveguide, the wavelengths of the electromagnetic radiation, and the desired coupling to the second waveguide portion 120.

Each of the second waveguide portions 120 illustrated in FIG. 1 may extend along the first direction in parallel with the first waveguide portion 110, and may be configured to out-couple light within a sub-range of the wavelength range of the light in the first waveguide portion 110. In the present example, the second waveguide portions 120 may be configured to couple out for example red, green or blue light to allow those colours to be detected separately at the photodetector. Thus, by out-coupling a sub-range corresponding to for example red, green or blue light, a contrast in signal may be achieved between the light transmitted through the first waveguide portion 110 and the second waveguide portion 120.

The second waveguide portions 120 may, similarly to the first waveguide portions 110 be dimensioned with straight sidewalls (as illustrated in FIG. 1) or by one or several tapered sidewalls. The cross sectional shape may be determined by the wavelengths that is to be out-coupled.

As indicated in the present figure, the second waveguide portions 120 may be arranged slightly spaced apart from the first waveguide portions 110, such that they are separated by a vertical gap extending along the length direction of the waveguide portions. Other configurations are however possible, in which the first and second waveguide portions are arranged in contact with each other or formed from a single piece. An example of such a configuration will be discussed in connection with FIG. 2.

Preferably, the first waveguide portion 110 and/or the second waveguide portion 120 and, optionally, the funnel element 130 may be at least partly surrounded or embedded in a material having a lower refractive index than the material of the waveguide portions. Examples of such materials/surroundings may include vacuum, air, and silicon dioxide.

The first and second waveguide portions 110, 120 and the funnel element 130 may be formed of a material comprising silicon, such as for instance silicon nitride. For visible light applications, the upper surface 132 of the funnel element 130, through which the incoming light enters the detector 100, may for example have a size of about 400 nm×400 nm, and may further be configured to funnel the light into the first waveguide portion 110 having a cross section of about 200 nm×200 nm. In the present example of FIG. 1, the total length of the first waveguide 110 and the funnel element 140 may be about 3 μm.

Depending on the dimensions of the coupling region, i.e., the interface between the first and second waveguide portions 110, 120, light within the sub-range may be coupled into the second waveguide portion 120 and guided towards the photodetector arranged at the lower end portions 114, 124 of the first and second waveguide portions 110, 124, respectively. The waveguide portions 110, 120 may be arranged directly on the photodetector 140 such that the end surfaces, through which the guided light may exit the waveguide portions 110, 120, are in direct contact with the photodetector 140.

In FIG. 1 a photodetector 140 according to an embodiment is disclosed. The photodetector may comprise a photoactive layer 144 configured to respond to photons photoelectrically, thereby allowing the guided light to form an electric signal that can be measured. The photoactive layer may for example be a layer of amorphous silicon, germanium, or perovskite.

The photoactive layer 144 may be covered by a contact layer 142, such as instance an optically transparent and electrically conducting layer arranged between the photoactive layer and the first and second waveguide portions 110, 120. The contact layer 142 may for example comprise indium tin oxide, ITO.

The photoactive layer 144 may be provided above a substrate 148, such as for example a silicon substrate 148, being a front-end-of-line substrate comprising transistors and other devices for handling the electric signal generated by the guided light. Further, an interconnect layer 146 may be arranged between the photoactive layer 144 and the substrate 148 for transmitting the signal between the two. As indicated in the present figure, the interconnect layer 146 may comprise a plurality of electrodes, each of which being arranged to contact the photoactive layer 144 at positions corresponding to the positions in which the guided light is transmitted to the photoactive layer 144 by the waveguide portions 110, 120. Preferably, the electrodes are arranged as close as possible to the waveguide portions 110, 120, such as 500 nm or less.

FIG. 1 illustrates an example comprising six pairs of first and second waveguide portions 110, 120. Two types of colour splitting waveguides, i.e., first waveguide portions, are used—a first type 120' for red light, and a second type 120" for blue light—whereas the first waveguide portions 110 are used for green light. With this configuration, each pair of first and second waveguide portions may be capable of providing a contrast in signal between green light and either red or blue light.

Figure 2:
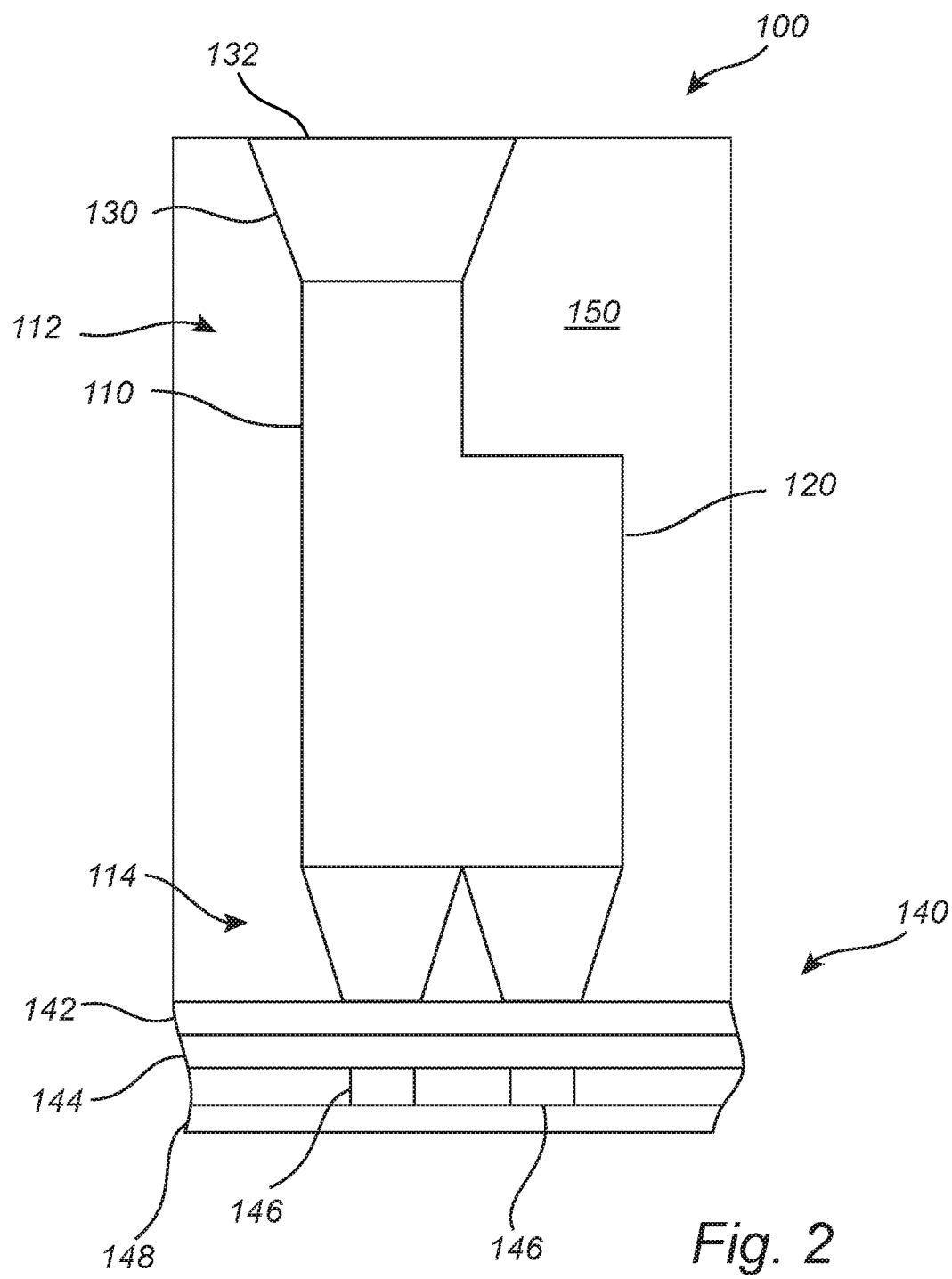
FIGS. 2-4 are cross-sectional views of a semiconductor detector according to some embodiments.

FIG. 2 is a cross section of a semiconductor detector 100 according to an embodiment, which may be similarly configured as the detector discussed in connection with FIG. 1. In the present embodiment, a first waveguide portion 110 and a second waveguide portion 120 are arranged between a funnel element 140 and a photodetector 140. The present embodiment however differs from the embodiment in FIG. 1 in that the first and second waveguide portions 110, 120 are made of a single piece, such that the first and second waveguide portions 110, 120 are defined by different regions of a same waveguide body. The first waveguide portion 110 may hence be represented by the portion of the waveguide body extending all the way between the funnel element and the photodetector 140, whereas the second waveguide portion 120 may be represented by a shorter portion of the waveguide body, i.e., a portion that does not reach all the way up to the level at which the funnel element 130 is arranged.

Further, each of the first and second waveguide portions 110, 120 may comprise a funnel shaped end portion 114, 124 facing the photodetector. The funnel shaped end portions 114, 124 may be arranged to funnel light, which has been guided through the waveguide portions 110, 120, into the contact layer 142 and the photoactive layer 144.

In the present example, the first and second waveguide portions 110, 120 and the funnel element 130 may be at least partly surrounded by a material 150 having a lower refractive index than the material of the waveguide portions 110, 120 and the funnel element 130. The material may for example be silicon dioxide, and may be provided to mechanically support and strengthen the device. Other examples that the one disclosed in FIG. 2 are however possible, in which the material 150 for example may be provided to only partly embed or enclose the waveguide portions 110, 120, be provided at one or a few surfaces of the waveguide portions 110, 120, and/or between two neighbouring portions 110, 120.

The embodiments of FIGS. 1 and 2 show waveguide portions 110, 120 having a substantially uniform cross section along their length direction. Other configurations are however also possible, in which the cross section may vary along over the length of the waveguide portions.

Figure 3:
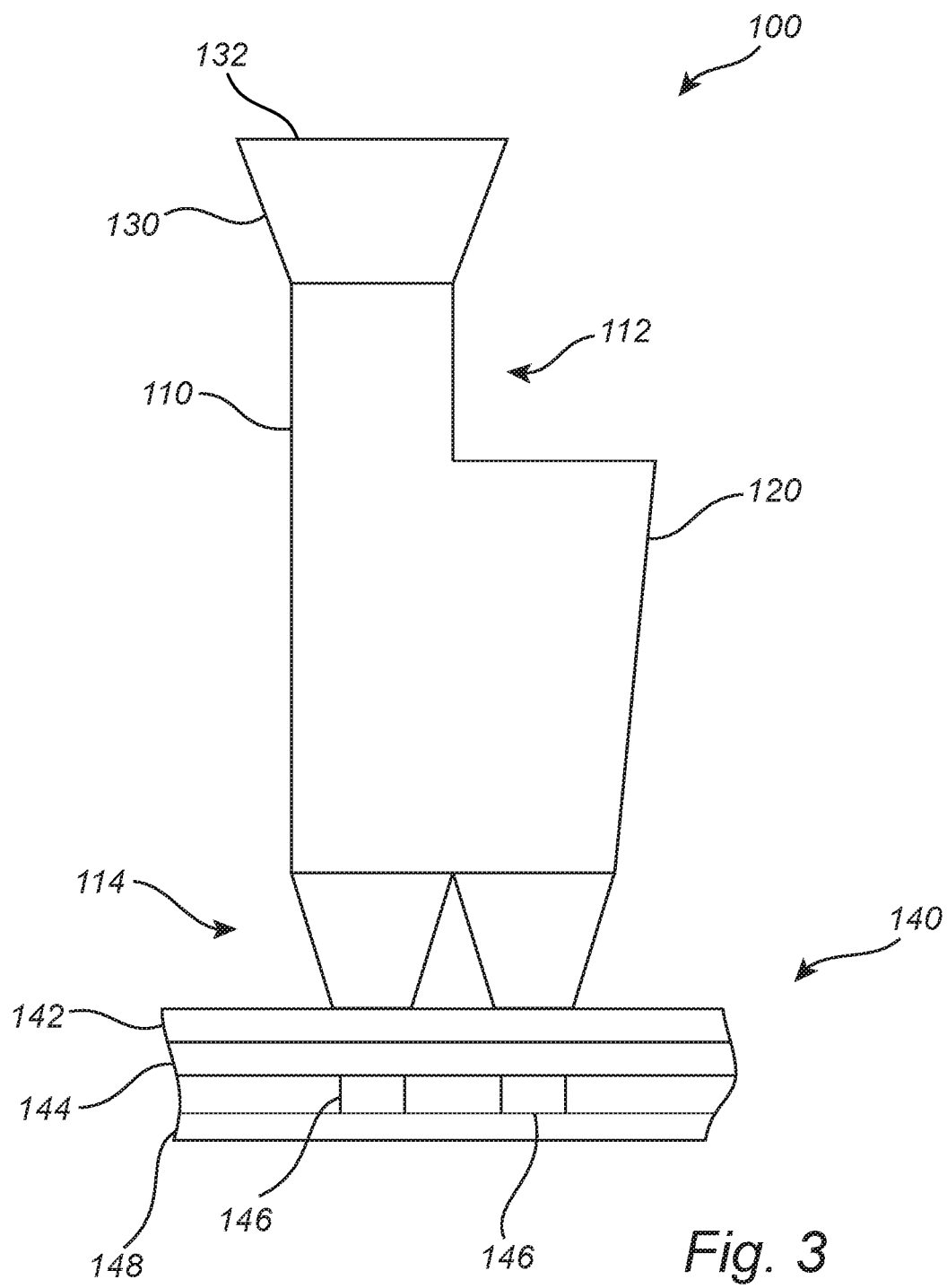

An example of such a configuration is disclosed in FIG. 3. According to this embodiment, which otherwise may be similar to the embodiments of FIGS. 1 and 2, the second waveguide portion 120 may be tapered such that its width decreases towards the photodetector 140. This may be advantageous from both a manufacturing and a performance point of view.

Figure 4:
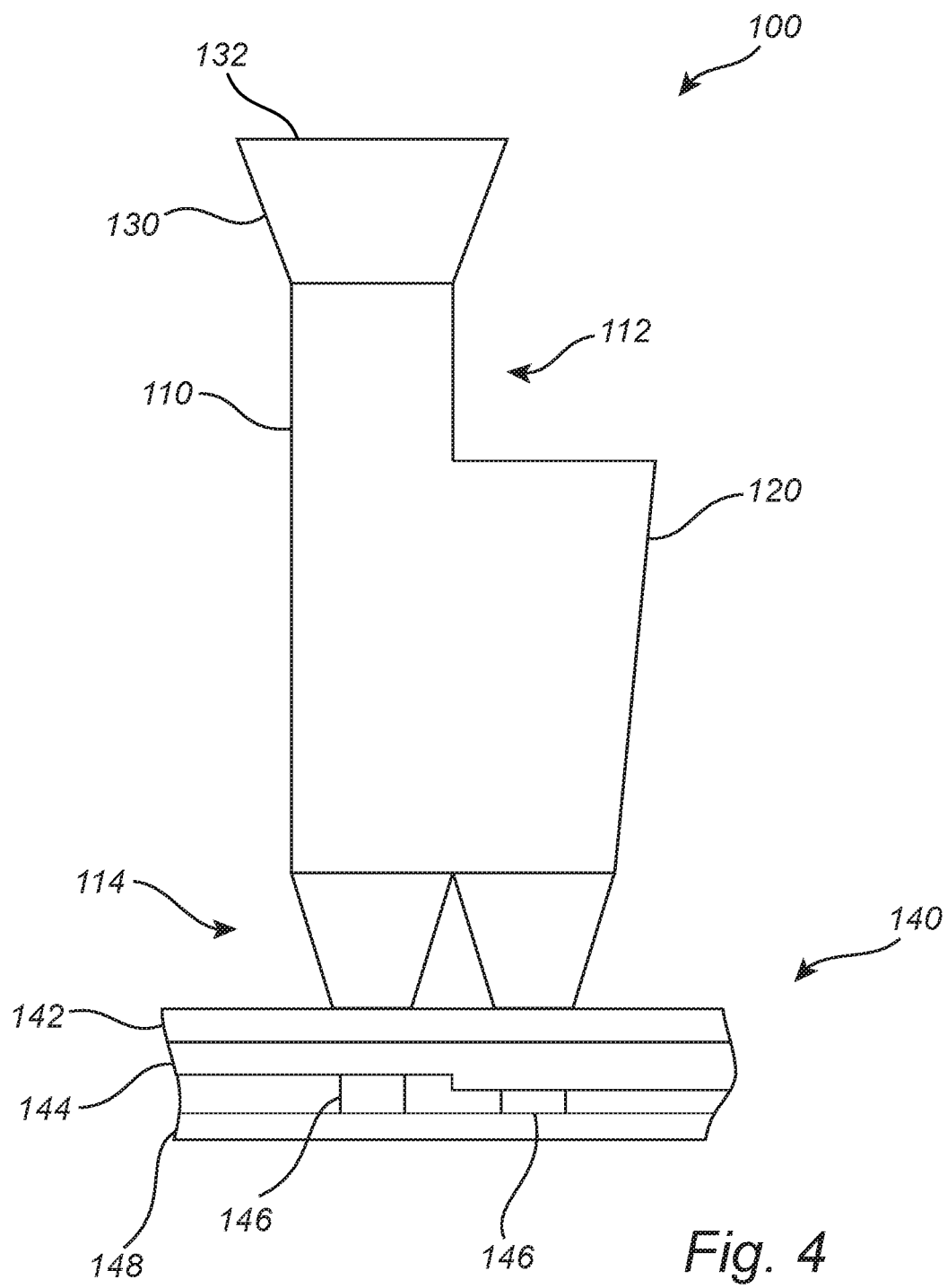

The configuration of the photodetector 140 may also be varied to improve its capability to detect different wavelength ranges. In FIG. 4, an example is illustrated in which the thickness of an electrode in the interconnect layer 146 has been decreased for the light guided through the second waveguide portion 120. As indicated in the present figure, the vertical thickness of the electrode under the second waveguide portion has been decreased in relation to the electrode under the first waveguide portion 110. By adjusting the electrode thickness to specific wavelength ranges, the overall performance of the photodetector 140 may be improved.

Figure 5:
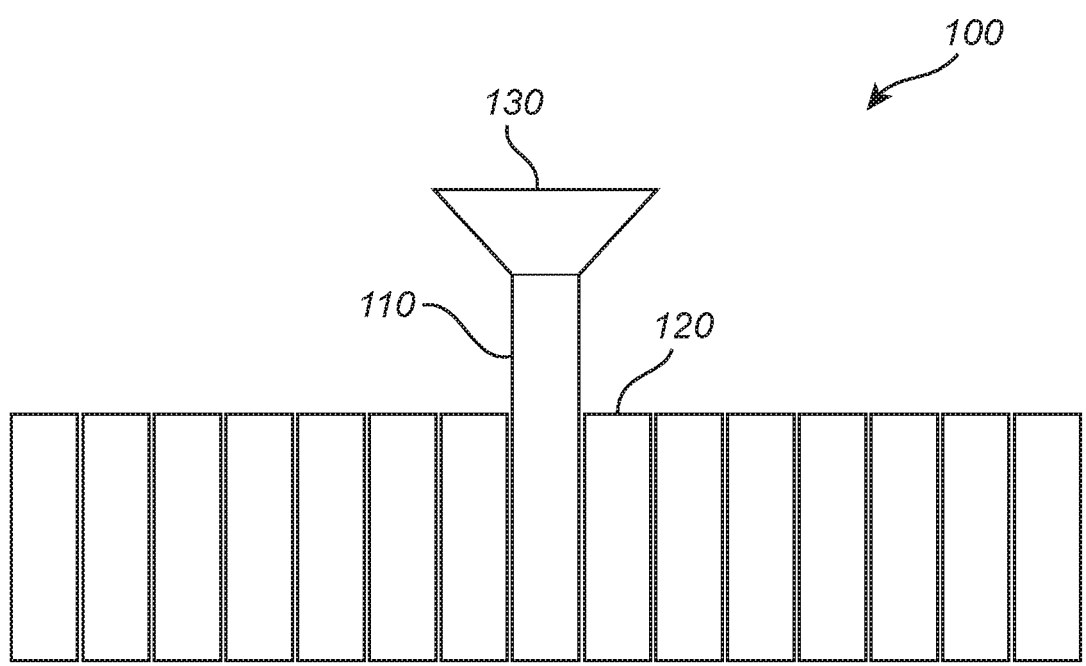
FIG. 5 is a cross-sectional view of a semiconductor detector according to another embodiment.

FIG. 5 shows a further embodiment, in which a plurality of second wavelength portions 120 may be used in a detector that otherwise may be similar to the detectors discussed in relation to FIGS. 1 to 4. In the present example, the detector 100 may comprise a first waveguide portion 110 extending between a funnel element 130 and the photodetector (not shown in FIG. 3). The plurality of second waveguide portions 120, or colour splitting waveguides, may be arranged at one or several sides of the first waveguide portion 110 in order to enable more specific wavelengths to be separately detected. By arranging the second waveguide portions 120 in an array, in which light is allowed to be coupled between neighbouring ones of the second waveguide portions 120, it is possible to differentiate between a plurality of different wavelength sub-ranges. As discussed in connection with the previous embodiments, the second waveguide portions 120 may either be provided as separate structures that are arranged spaced apart or in contact with each other (and, possibly, the first waveguide portion 110). Alternatively, the first and second waveguide portions 110, 120 may be defined by different portions or regions of a common waveguide body.

In the above, the inventive concept has mainly been described with reference to a limited number of examples. However, as is readily appreciated by a person skilled in the art, other examples than the ones disclosed above are equally possible within the scope of the inventive concept as defined by the appended claims.

The invention claimed is:

1. A semiconductor detector for electromagnetic radiation within a wavelength range, comprising:
a first waveguide portion extending in a first direction and configured to be a single-mode waveguide for electromagnetic radiation within the wavelength range;
a funnel element configured to funnel incident electromagnetic radiation into a first end of the first waveguide portion;
a second waveguide portion extending along the first direction and parallel with the first waveguide portion, and being configured to selectively guide electromagnetic radiation within a sub-range of the wavelength range;
wherein said second waveguide portion is coupled to the first waveguide portion and configured to out-couple electromagnetic radiation from the first waveguide portion, within the sub-range; and
a photodetector including a photoactive layer arranged at a second end of the first waveguide portion and at an end of the second waveguide portion, and configured to separately detect electromagnetic radiation transmitted through and exiting the first waveguide portion and the second waveguide portion in the first direction.

2. The detector of claim 1, wherein the first waveguide portion and the second waveguide portion are defined by different regions of a same waveguide.

3. The detector of to claim 1, wherein the first waveguide portion and the second waveguide portion are separate waveguides.

4. The detector of claim 3, wherein the first waveguide portion and the second waveguide portion are separated by a distance less than 45 nm.

5. The detector of claim 1, wherein the second waveguide portion is shorter than the first waveguide portion.

6. The detector of claim 5, wherein a length of the second waveguide portion corresponds to a coupling length required to out-couple a wavelength within the sub-range of the wavelength range.

7. The detector of claim 1, wherein a separation between the photoactive layer and the second end of the first waveguide portion and the end of the second waveguide portion is below a wavelength of the electromagnetic radiation out-coupled from the first waveguide portion.

8. The detector of claim 1, further comprising a contact layer between the photoactive layer and the first waveguide portion and the second waveguide portion.

9. The detector of claim 1, wherein at least one of the second end of the first waveguide portion and the end of the second waveguide portion has a funnel shape.

10. The detector of claim 1, wherein at least one of the first waveguide portion and the second waveguide portion has at least one tapered sidewall.

11. The detector of claim 10, wherein a tapering angle is approximately 85°.

12. A semiconductor detector for electromagnetic radiation within a wavelength range, comprising:
a first waveguide portion extending in a first direction and configured to be a single-mode waveguide for electromagnetic radiation within the wavelength range;
a funnel element configured to funnel incident electromagnetic radiation into a first end of the first wavequide portion;
a second waveguide portion extending along the first direction and parallel with the first waveguide portion, and being configured to selectively guide electromagnetic radiation within a sub-range of the wavelength range;
wherein said second wavequide portion is coupled to the first wavequide portion and configured to out-couple electromagnetic radiation from the first waveguide portion, within the sub-range; and a photodetector including a photoactive layer arranged at a second end of the first wavequide portion and at an end of the second wavequide portion, and configured to separately detect electromagnetic radiation transmitted through and exiting the first waveguide portion and the second waveguide portion in the first direction, wherein the photodetector further comprises an interconnect layer arranged below the photoactive layer, the interconnect layer comprising a plurality of electrodes, each of which being aligned with a respective one of the first and second waveguide portions, and wherein a thickness of the electrodes differs between the first and second waveguide portions.

* * * * *